(12) United States Patent
Kaneda (10) Patent No.: US 11,095,095 B2
(45) Date of Patent: Aug. 17, 2021

(54) LOW COST EXTERNAL CAVITY DIODE LASERS

(71) Applicant: Arizona Board of Regents on Behalf of the University of Arizona, Tucson, AZ (US)

(72) Inventor: Yushi Kaneda, Tucson, AZ (US)

(73) Assignee: ARIZONA BOARD OF REGENTS ON BEHALF OF THE UNIVERSITY OF ARIZONA, Tucson, AZ (US)

( * ) Notice: Subject to any disclaimer, the term of this patent is extended or adjusted under 35 U.S.C. 154(b) by 21 days.

(21) Appl. No.: 16/553,039

(22) Filed: Aug. 27, 2019

(65) Prior Publication Data

US 2020/0067277 A1    Feb. 27, 2020

Related U.S. Application Data

(60) Provisional application No. 62/723,382, filed on Aug. 27, 2018.

(51) Int. Cl.
*H01S 5/14* (2006.01)
*H01S 5/323* (2006.01)

(52) U.S. Cl.
CPC .............. *H01S 5/143* (2013.01); *H01S 5/141* (2013.01); *H01S 5/32325* (2013.01); *H01S 5/32341* (2013.01)

(58) Field of Classification Search
CPC ...... H01S 5/141; H01S 5/143; H01S 5/32341; H01S 5/32325
See application file for complete search history.

(56) References Cited

U.S. PATENT DOCUMENTS

| | | | | | |
|---|---|---|---|---|---|
| 5,537,432 | A | * | 7/1996 | Mehuys | G02B 6/12004 372/32 |
| 5,703,894 | A | * | 12/1997 | Valster | H01L 33/0062 372/46.016 |
| 6,091,755 | A | * | 7/2000 | Sanders | H01S 5/10 372/102 |

(Continued)

OTHER PUBLICATIONS

M. Boyd, "High Precision Spectroscopy of Strontium in an Optical Lattice: Towards a New Standard for Frequency and Time," Ph.D. dissertation, University of Colorado (2002).

(Continued)

*Primary Examiner* — Michael Carter
(74) *Attorney, Agent, or Firm* — Perkins Coie LLP (57) ABSTRACT

External cavity diode laser (ECDL) devices and methods for producing the same are described that allows ECDLs to be readily produced and configured to operate at a desired range of wavelengths, while allowing tunability of the output wavelength. One ECDL includes a laser gain chip including a gain medium, a first reflective surface at a first end of the gain medium, and a second surface at a second end of the gain medium opposite to the first reflective surface. The second surface has a facet that forms an angle approximately equal to Brewster's angle for light having a first wavelength. The ECDL further includes a diffraction grating positioned to receive light that passes through the second surface, to operate as a mirror in the external cavity diode laser, and to allow a portion of the light to be directed outside of the external cavity diode laser as output light.

11 Claims, 6 Drawing Sheets

(56) References Cited

U.S. PATENT DOCUMENTS

2015/0085891 A1* 3/2015 Watanabe ............... H01S 5/143
372/50.11

OTHER PUBLICATIONS

A. L. Bloom, "Modes of a laser resonator containing tilted birefringent plates," J. Opt. Soc. Am. 64, 447-452 (1974).

"Market Profile: Process Raman Spectroscopy," available at http://www.spectroscopyonline.com/spectroscopy/Departments%3A+Market+Profile/Market-Profile-Process-Raman-Spectroscopy/ArticleStandard/Article/detail/676251 dated Jun. 1, 2010.

K. Licha et al., "Optical imaging in drug discovery and diagnostic applications", Advanced Drug Delivery Reviews 57 (8), (2005).

J. Zhang et al., "Creating new fluorescent probes for cell biology". Nature Reviews Molecular Cell Biology 3, (2002).

Y. Kaneda et al., "Continuous-wave all-solid-state 244 nm deep-ultraviolet laser source by fourth-harmonic generation of an optically pumped semiconductor laser using CsLiB6O10 in an external resonator," Optics Letters 33, 1705-1707 (2008).

J. Paul et al., "Doppler-free spectroscopy of mercury at 253.7 nm using a high-power, frequency-quadrupled, optically pumped external-cavity semiconductor laser," Optics Letters 36, 61-63 (2011).

Y. Kaneda et al., "Continuous-wave, single-frequency 229 nm laser source for laser cooling of cadmium atoms," Optics Letters 41, 705-708 (2016).

J. Sakuma et al., "Continuous-wave 193.4 nm laser with 120 mW output power," Optics Letters 40, 5590-5593 (2015).

\* cited by examiner

| λ | Index | Material | $\theta_B$ | $\theta_1$ | $\theta_2$ |
|---|---|---|---|---|---|
| 369.5 | 2.637 | GaN | 69.23 | 20.77 | 48.46 |
| 408 | 2.546 | GaN | 68.56 | 21.44 | 47.11 |
| 422 | 2.523 | GaN | 68.38 | 21.62 | 46.76 |
| 435.5 | 2.505 | GaN | 68.24 | 21.76 | 46.48 |
| 450 | 2.487 | GaN | 68.10 | 21.90 | 46.19 |
| 480 | 2.4582 | GaN | 67.86 | 22.14 | 45.73 |
| 674 | 3.49 | AlInGaP | 74.01 | 15.99 | 58.02 |
| 687 | 3.49 | AlInGaP | 74.01 | 15.99 | 58.02 |
| 935.2 | 3.442 | InGaAs | 73.80 | 16.20 | 57.60 |
| 1004 | 3.445 | InGaAs | 73.81 | 16.19 | 57.63 |
| 1033 | 3.455 | InGaAs | 73.86 | 16.14 | 57.72 |
| 1092 | 3.378 | InGaAs | 73.51 | 16.49 | 57.02 |

LOW COST EXTERNAL CAVITY DIODE LASERS

RELATED APPLICATIONS

This application claims priority to the provisional application with Ser. No. 62/723,382, titled "Low Cost External Cavity Diode Lasers," filed Aug. 27, 2018. The entire contents of the above noted provisional application are incorporated by reference as part of the disclosure of this document.

TECHNICAL FIELD

The subject matter of this patent document relates generally to laser devices and systems, and in particular, to external cavity diodes laser devices and associated methods that allow output wavelength selectivity and tunability.

BACKGROUND

External cavity diode lasers (ECDLs) are increasingly used as light sources in many applications that range from industrial photonic systems to laboratory and research projects. The advantages of ECDLs include the stability of their output frequency and their narrow spectral bandwidth. The currently available EDCLs, however, are expensive and bulky, and can generate output light within only a small range of wavelengths.

SUMMARY OF CERTAIN EMBODIMENTS

The disclosed embodiments describe low cost external cavity diode laser (ECDL) devices and methods for producing the same that allows ECDL configurations to be readily produced and configured to operate at a desired range of wavelengths, while allowing tunability of the output wavelength.

One aspect of the disclosed embodiment relates to an external cavity diode laser that includes a laser gain chip including a gain medium, a first reflective surface at a first end of the gain medium operable as a first mirror of the external cavity diode laser, and a second surface at a second end of the gain medium opposite to the first reflective surface. The second surface has an angled facet that forms an angle that is approximately equal to a Brewster's angle for light having a first wavelength. The ECDL further includes a diffraction grating positioned to receive light that passes through the second surface, to operate as a second mirror in the external cavity diode laser, and to allow a portion of the light to be directed outside of the external cavity diode laser as output light.

DETAILED DESCRIPTION

In the following description, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

Figure 1:
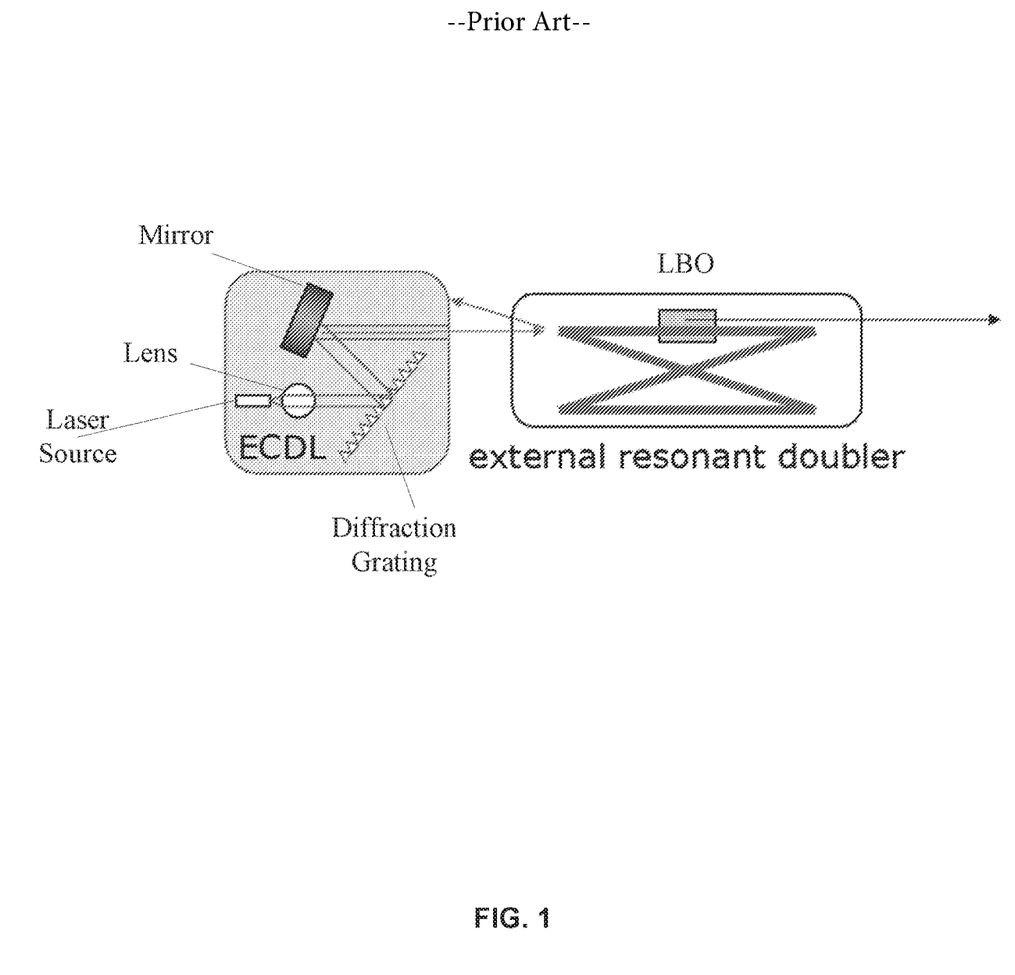
FIG. 1 illustrates an example configuration of a typical external cavity diode laser (ECDL).

The disclosed technology is used in conjunction with an external cavity diode laser (ECDL). ECDLs typically emit single-frequency radiation at an output power of tens of milliwatt (mW). FIG. 1 shows an exemplary configuration of an ECDL that includes a laser source, a lens, a diffraction grating and, optionally, a folding mirror to redirect the output beam direction, if needed. The laser source is a laser diode chip which typically has an anti-reflection coating at one end to allow light to exit the laser chip and to propagate to the external feedback element such as a grating, or any optics/optical system including wavelength selective element(s). The lens can be used to collimate that light output from the laser chip and to direct it to the diffraction grating that functions as the end mirror (a back surface of the laser gain chip operates as a second mirror of the cavity). The first-order diffracted beam provides optical feedback to the laser diode chip (which has an anti-reflection coating on its right-hand end). The output wavelength can be tuned by rotating the diffraction grating. In some applications, the light output from the ECDL is directed to an external resonant doubler that includes a non-linear crystal, such as LBO or BBO, to convert the laser light to shorter wavelengths. For example, if the laser light that is output from the ECDL is 976 nm, the light at the output of the frequency doubler is at 488 nm.

Figure 6A:
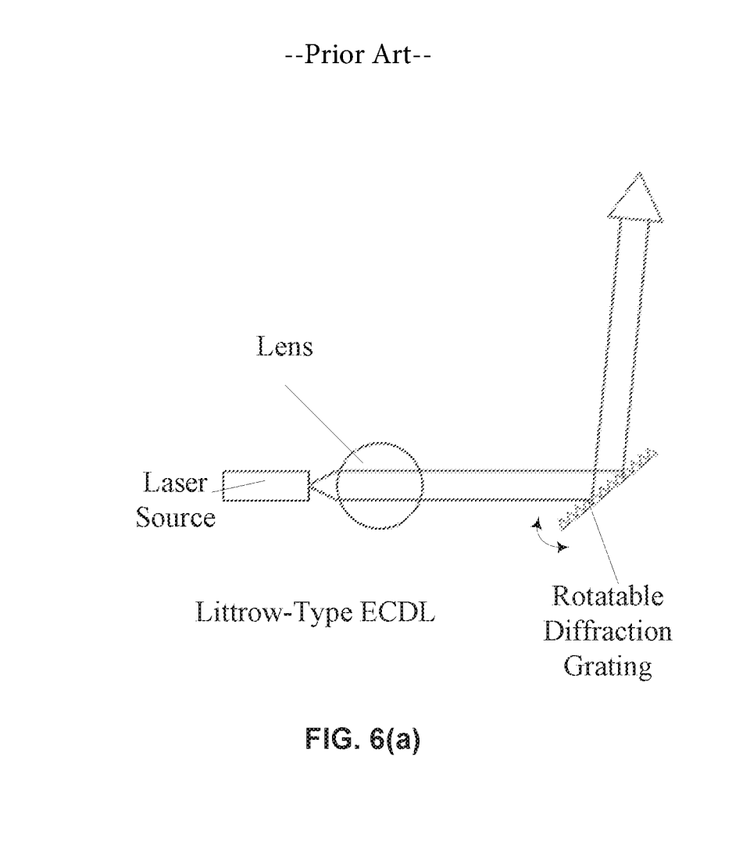
FIG. 6(a) illustrates an example configuration of a Littrow-type ECDL.
Figure 6B:
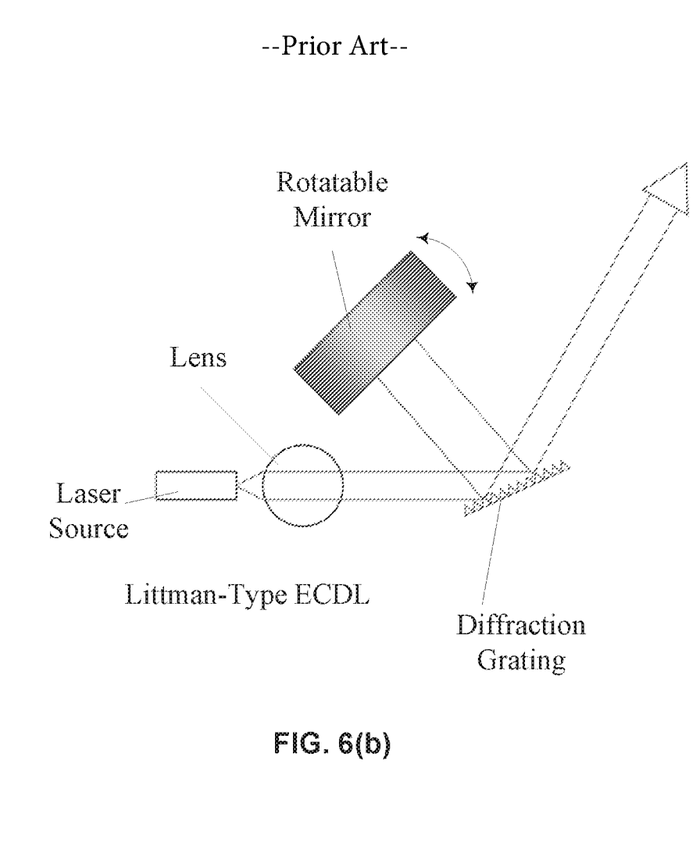
FIG. 6(b) illustrates an example configuration of a Littman-type ECDL including a folding mirror.

It should be noted that the configuration of FIG. 1 illustrates a typical Littrow configuration and is provided by the way of example, and not by limitation, to facilitate the understanding of the disclosed technology. The disclosed technology, however, can be implemented using other configurations, including but not limited to, a Littman configuration. FIG. 6(a) shows simplified diagrams of a Littrow-type ECDL and FIG. 6(b) illustrates a Littman-type ECDL. The components in the Littrow-type ECDL are similar to those shown in FIG. 1 (with the exception of the optional folding mirror which is added in FIG. 1). In the Littrow-type ECDL, the tuning of the output light is accomplished by rotating the grating as shown by the double-sided arrows in FIG. 6(a). In the Littman-type ECDL, the position of the diffraction grating (and thus the direction of output light) is fixed, and tuning of the output wavelength is accomplished by moving the rotatable mirror as shown by the double-sided arrows in FIG. 6(b).

ECDLs that are currently available are expensive and bulky, and each ECDL can only generate output light within a limited range of wavelengths. This is due in-part to a lack of available diode laser "gain chips" with proper antireflection (AR) coatings on the front facet for operating in a wide range of wavelengths, making the construction of ECDL difficult and/or expensive. Having custom diode gain chips made with specifically designed AR coatings is certainly an option, but can be quite expensive and can take a long time to be manufactured, which makes this option not generally feasible. Another option is, in some configurations, to generate additional wavelengths of interest by including non-linear frequency conversion components in, for example, near infrared lasers. However, the inclusion of such components makes the laser system more complex, inefficient, and expensive. Moreover, in many cases, such systems also require optical amplifiers (e.g., semiconductor tapered amplifiers) to generate more than a few tens of mW output power. Inclusion of such amplifiers can significantly increase the cost and complexity of the system, while reducing the reliability of the laser system.

According to the disclosed embodiments, low cost ECDL configurations can are readily produced, and configured to operate at a desired range of wavelengths, while allowing additional tunability of the output wavelength. Moreover, such low cost ECDL systems can be implemented using commercially available laser diodes that are, for example, used in consumer electronic devices, such as Blu-ray players, and are therefore available at a relatively low cost.

In some embodiments, the process of producing the ECDL systems includes obtaining a low-cost laser chip that includes an AR coating designed to allow the laser to operate at a particular output wavelength. As the next step, the AR coating is removed, using, for example, a focused ion beam (FIB) etch technique. FIB is typically used to "machine" materials at microscopic scales and it allows "milling" of the solid materials such as semiconductors. This process can be used to etch the front facet of a conventional laser diode to remove the existing reflective coating, expose the bare material, and to cleave a surface of the gain medium of the semiconductor crystal such that the surface forms a desired angle.

Figure 2:
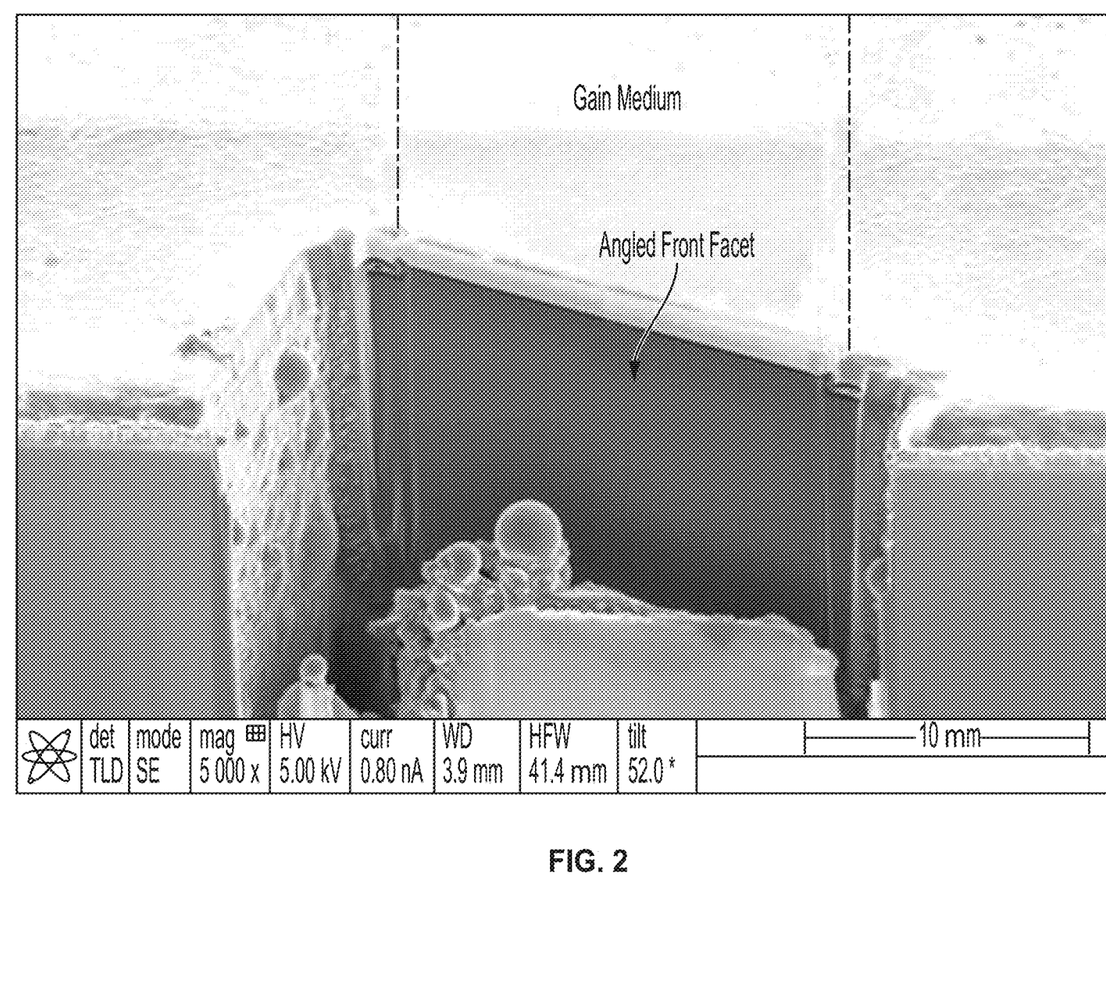
FIG. 2 illustrates an example diode laser having front facet that is etched at an angle in accordance with the disclosed embodiments.

FIG. 2 shows an example of an indium gallium nitride (InGaN) diode laser with its front facet etched at an angle. The angle is approximately 22 degrees, which is chosen so that the TE mode in the waveguide experiences near Brewster-condition (n~2.49) low-reflection, and very small coupling of reflection (which is already small) back into the waveguide. As expected, this device does not show any laser oscillation after the facet is etched. However, such a laser chip can be used as part of an ECDL in accordance with the disclosed embodiments to provide output light at a desired wavelength.

Figure 3:
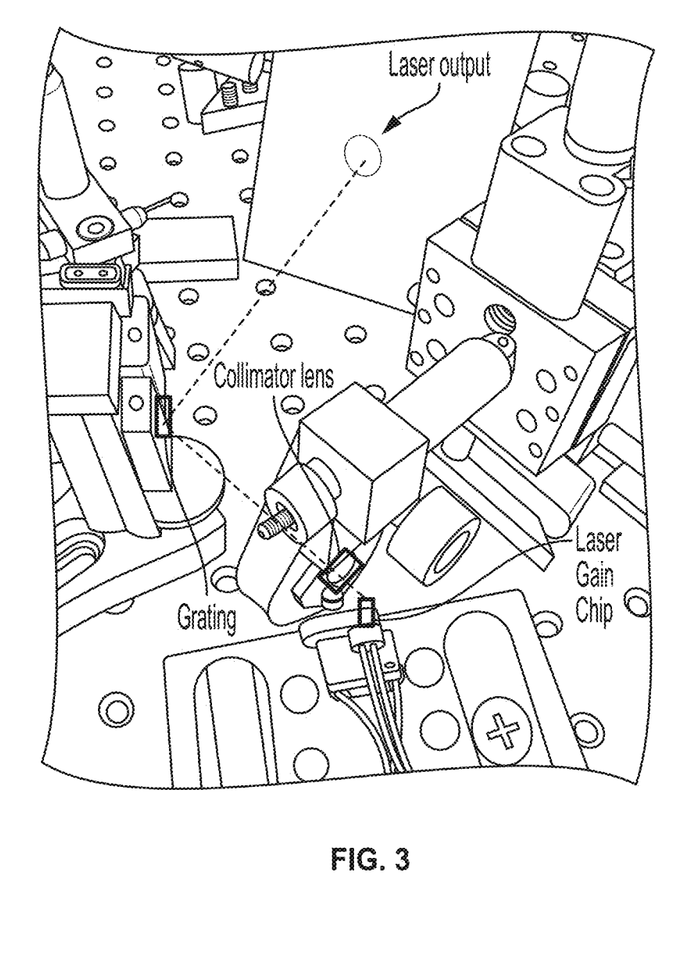
FIG. 3 illustrates an example wavelength tunable ECDL prototype system that includes a laser chip with an angle-etched facet in the gain region in accordance with the disclosed embodiments.

FIG. 3 shows a prototype benchtop system that includes a laser chip having an angle-etched facet in the gain region, a collimating lens that direct the light to a grating to complete the ECDL cavity and to produce an output light on a screen. The depicted system is in a Littrow configuration and the grating feeds back into itself. The system in FIG. 3 provides tunability by more than a few nanometers in wavelength. As briefly described earlier, a Littrow configuration of grating-feedback ECDL is simple and relatively easy to build, and allows the output wavelength to be adjusted by, for example, mechanical motion of the grating, which causes the output beam to deflect as the grating is tuned. Unlike the Littrow configuration, a Littman configuration can tune the wavelength without deflecting the beam (i.e., the direction of output beam is fixed); however, due to its lower feedback (diffraction) efficiency (light must be diffracted twice), the Littman configuration is more inefficient than a Littrow configuration, and may not be suitable in all applications.

As noted above, the angle of the front facet of the laser chip is approximately equal to the Brewster's angle. Brewster's angle is an angle of incidence at which light with a particular polarization is perfectly transmitted through a transparent dielectric surface, with no reflection. When light moves from a first medium having a first index of refraction, $n_1$, to a second medium having a second index of refraction, $n_2$, part of the light at the boundary between two media is usually reflected while part of the light is refracted and entered into the second medium. The fraction of the light that is reflected depends on the polarization of the incident light and the angle of incidence. P-polarized light (i.e., electric field polarized in the same plane as the incident light and the surface normal at the point of incidence) will not be reflected if the angle of incidence is at the Brewster's angle given by:

$$\theta = \arctan\left(\frac{n2}{n1}\right).$$

Figure 4:
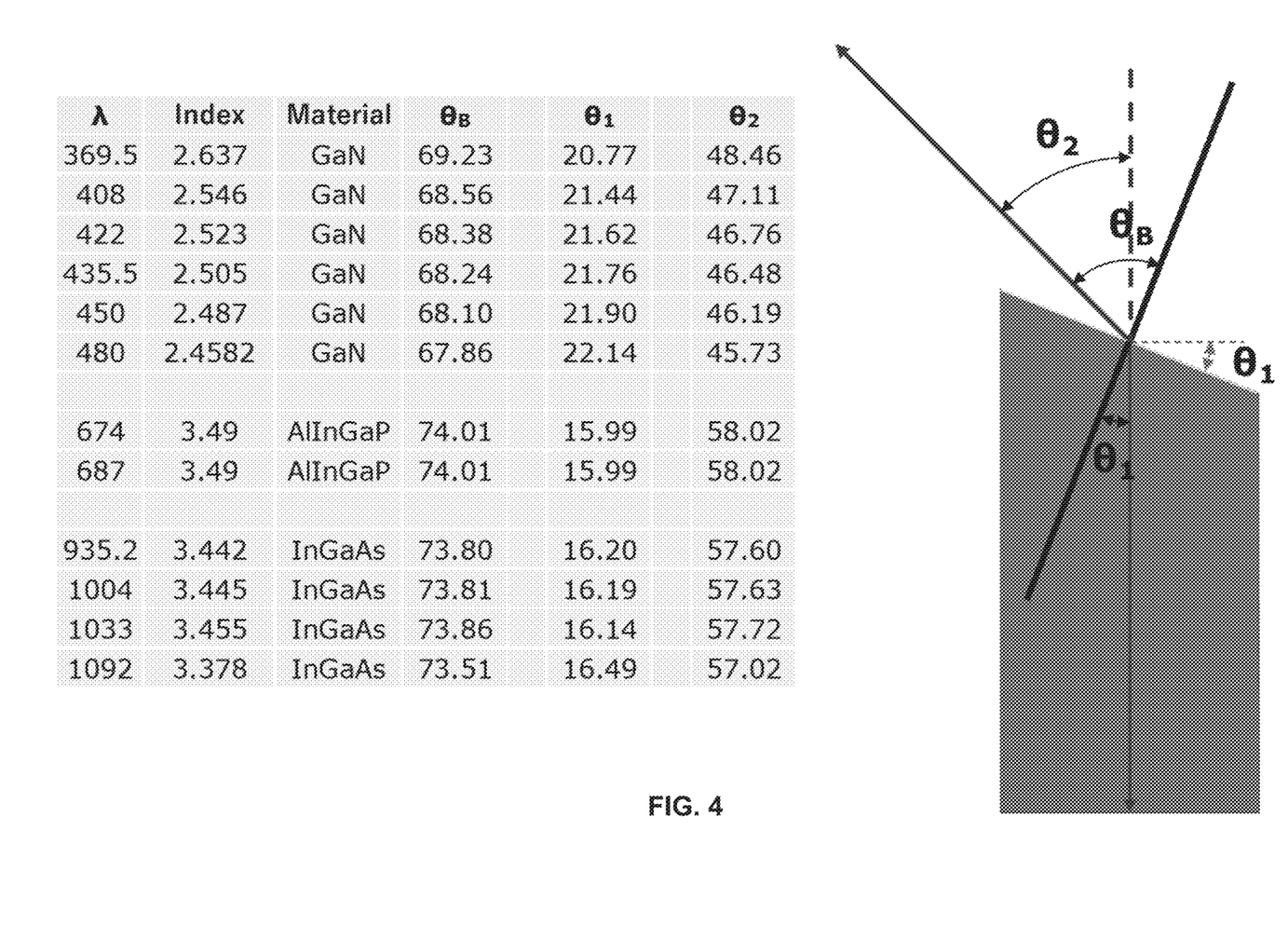
FIG. 4 illustrates a set of example values relating the wavelength of light, the laser gain material, the angles of incidence and refraction, and the Brewster's angle.

FIG. 4 illustrates a set of example values relating the wavelength of light, the laser gain material, the angles of incidence and refraction, and the Brewster's angle (the diagram on the right-hand side of the table in FIG. 4 shows the convention used for naming the various angles at the gain medium-air interface). The values in FIG. 4 also illustrate the dependencies of the indices of refraction on the wavelength of light. The table in FIG. 4 can be used to select a particular angle for cutting the facet of the laser gain medium. The values in FIG. 4 are only examples of the ranges of wavelengths for the listed gain media. In particular, the top six rows of the table correspond to a wavelength range of 369.5 nm to 480 nm for gallium nitride (GaN) gain medium. In some exemplary implementations, the wavelength can be in the range 400 to 470 nm for GaN or indium gallium nitride (InGaN) gain media, and in the range 630 to 690 nm for aluminum indium gallium phosphide (AlInGaP) gain medium.

Figure 5:
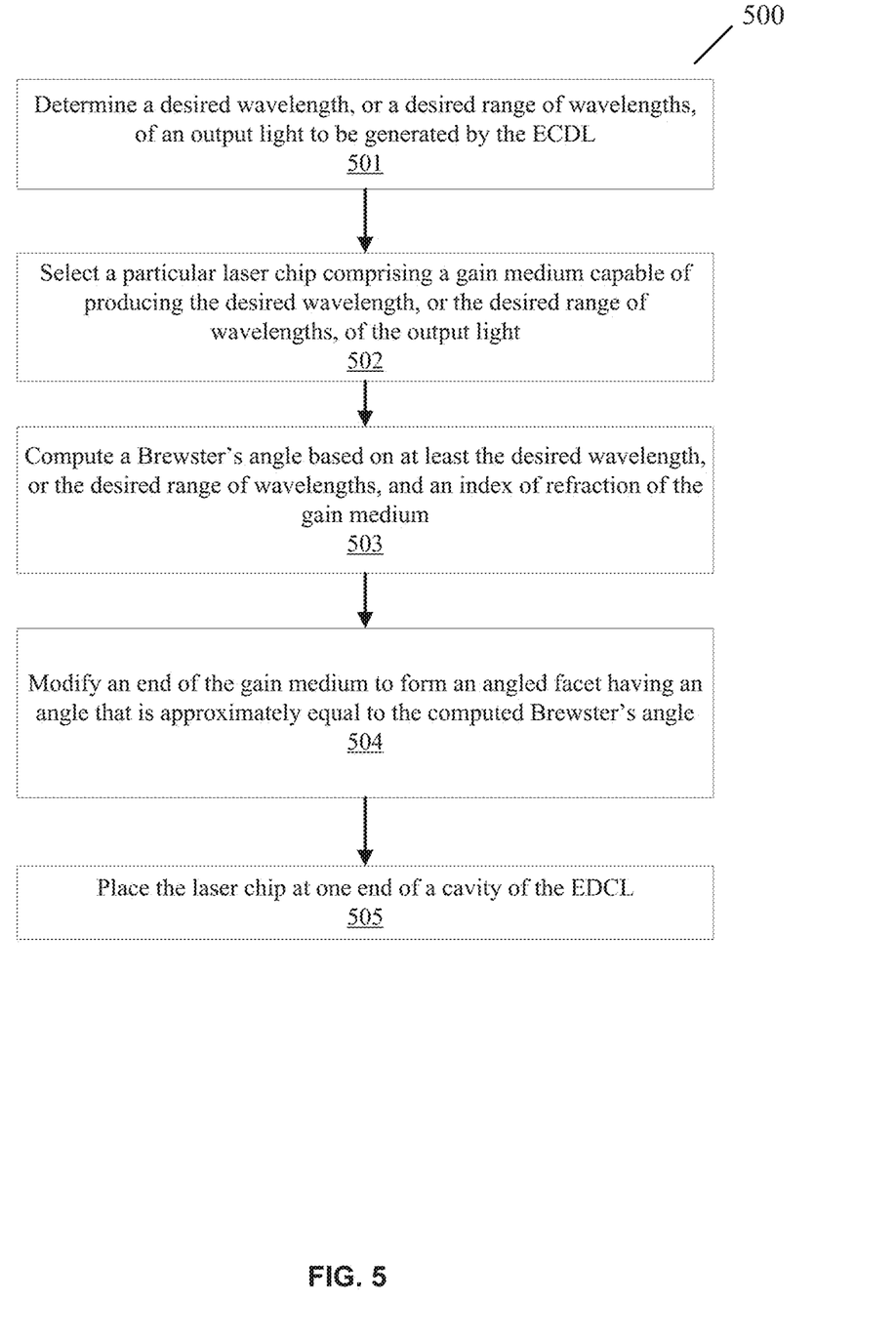
FIG. 5 illustrates a set of operations that can be carried out to produce an ECDL that is capable of generating an output light of a particular wavelength or range of wavelengths in accordance with an exemplary embodiment.

FIG. 5 illustrates a set of operations 500 in accordance with an exemplary embodiment that can be carried out to produce an ECDL that is capable of generating an output light of a particular wavelength or range of wavelengths. At 501, a desired wavelength, or a desired range of wavelengths, of an output light to be generated by the ECDL is determined. At 502, a particular laser chip having a gain medium capable of producing the desired wavelength, or the desired range of wavelengths, is selected. Such a laser chip can, for example, be selected from any variety of commercially available laser chips that are mass-produced for consumer electronic devices. At, 503, Brewster's angle is computed based on at least the desired wavelength, or the desired range of wavelengths, and the index of refraction of the gain medium. At 504, one end of the gain medium is modified to form an angled facet having an angle that is approximately equal to the computed Brewster's angle. At 505, the laser chip is placed at one end of a cavity of the ECDL. The ECDL can then be tested and tuned to determine the performance of the system. For example, a grating (in a Littrow-type ECDL) or a mirror in the (Littman-type ECDL) can be rotated to determine whether an output wavelength of interest can be obtained.

An external cavity diode laser that is produced according to one exemplary embodiment includes a laser gain chip that includes a gain medium, a first reflective surface at a first end of the gain medium operable as a first mirror the external cavity diode laser, and a second surface at a second end of the gain medium opposite to the first reflective surface. The second surface includes an angled facet forming an angle that is approximately equal to a Brewster's angle for light having a first wavelength. The ECDL also includes a diffraction grating positioned to receive light that passes through the second surface, to operate as a second mirror in the external cavity diode laser, and to allow a portion of the light to be directed outside of the external cavity diode laser as output light. The ECDL can also include a collimator lens positioned at a distance from the second surface to receive light that is output from the second surface and to provide collimated light that is incident on the grating.

In one exemplary embodiment, the external cavity diode laser includes a lens that is positioned between the second surface and the grating to direct light that is output from the second surface onto the grating, and to direct reflected light from the grating to the laser gain medium. In another exemplary embodiment, the gain medium includes gallium nitride (GaN) or indium gallium nitride (InGaN), and the first wavelength is in a wavelength range 400 to 470 nm. In yet another exemplary embodiment, the gain medium includes aluminum indium gallium phosphide (AlInGaP) and the first wavelength is in a wavelength range 630 to 690 nm.

According to another exemplary embodiment, the grating is rotatably positioned in the external cavity diode laser to allow tuning of output light wavelength to produce an output light having a second wavelength. In some embodiments, the grating can be rotatably positioned in the external cavity diode laser to allow tuning of output light wavelength to produce an output light having one of a plurality of wavelengths.

In some embodiments, the external cavity diode laser further includes a rotatable mirror positioned to receive at least a portion of light that is diffracted by the diffraction grating and to reflect the received portion back to the grating. In one example embodiment, the rotatable mirror is configured to enable tuning of output light wavelength to produce the output light having one of a plurality of wavelengths. According to another example embodiment, the laser gain chip having the angled facet becomes capable of producing laser oscillations at a wavelength, or range of wavelengths, corresponding to the Brewster's angle only when positioned in the external cavity diode laser. In another example embodiment, the Brewster's angle is selected to produce substantially no reflection, from the second surface, for light that travels from the first reflective surface to the second surface and to allow substantially all of the light that travels from the first reflective surface to the second surface to transmit through the second surface toward the grating.

Another aspect of the disclosed embodiments relates to a method for producing an ECDL that includes determining a desired wavelength, or a desired range of wavelengths, of an output light to be generated by the ECDL and selecting a particular laser chip comprising a gain medium capable of producing the desired wavelength, or the desired range of wavelengths, of the output light. The above-noted method further includes computing a Brewster's angle based on at least the desired wavelength, or the desired range of wavelengths, and an index of refraction of the gain medium, modifying a second end (or an output end) of the gain medium to form an angled facet having an angle that is approximately equal to the computed Brewster's angle, and placing the laser chip at one end of a cavity of the ECDL.

In one exemplary embodiment, the particular laser chip includes an antireflection coating at the second end of the laser gain medium, and the method further includes removing the antireflection coating prior to modifying the second surface (or the output end). In yet another exemplary embodiment, removing the antireflection coating includes using a focused ion beam (FIB) etching process. In still another exemplary embodiment, modifying the second end includes using a focused ion beam (FIB) etching process to remove a section of the second end to form the angled facet. In one exemplary embodiment, the ECDL includes a rotatable grating, and the method for producing the ECDL includes positioning the grating to allow light that is output from the laser chip to be directed to the rotatable grating at an inclined angle. In another exemplary embodiment, the above noted method further includes operating the laser chip to produce an output light having a first wavelength, and tuning the ECDL by rotating the grating to produce an output light having a second wavelength that is different from the first wavelength.

In some embodiments, the ECDL further includes a rotatable mirror positioned to receive at least a portion of light that is diffracted by the diffraction grating and to reflect the received portion back to the grating, and the above-noted method further comprises rotating the rotatable mirror to produce the output light having a first wavelength. In one example embodiment, the method further includes rotating the rotatable mirror to produce the output light having a second wavelength different than the first wavelength. According to another example embodiment, the gain medium includes gallium nitride (GaN) or indium gallium nitride (InGaN), and the method further comprises tuning an output light of the ECDL to any wavelength in the range 400 to 470 nm. In yet another example embodiment, the gain medium includes aluminum indium gallium phosphide (AlInGaP) and the method further comprises tuning an output light of the ECDL to any wavelength in the range 630 to 690 nm.

The foregoing description of embodiments has been presented for purposes of illustration and description. The foregoing description is not intended to be exhaustive or to limit embodiments of the present invention to the precise form disclosed, and modifications and variations are possible in light of the above teachings or may be acquired from practice of various embodiments. The embodiments discussed herein were chosen and described in order to explain the principles and the nature of various embodiments and its practical application to enable one skilled in the art to utilize the present invention in various embodiments and with various modifications as are suited to the particular use contemplated. While operations are depicted in the drawings in a particular order, this should not be understood as requiring that such operations be performed in the particular order shown or in sequential order, or that all illustrated operations be performed, to achieve desirable results. The features of the embodiments described herein may be combined in all possible combinations of methods, apparatus, modules, and systems.

What is claimed is:
1. A method for producing an external cavity diode laser (ECDL), the method comprising:
   determining a desired wavelength, or a desired range of wavelengths, of an output light to be generated by the ECDL;
   selecting a particular laser chip comprising a gain medium capable of producing the desired wavelength, or the desired range of wavelengths, of the output light;

computing a Brewster's angle based on at least the desired wavelength, or the desired range of wavelengths, and an index of refraction of the gain medium;

modifying an output end of the gain medium to form an angled facet having an angle that is approximately equal to the computed Brewster's angle; and placing the laser chip at one end of a cavity of the ECDL, wherein the particular laser chip includes an antireflection coating at the output end of the laser gain medium, and the method further comprises removing the antireflection coating prior to modifying the output end.

2. The method of claim 1, wherein removing the antireflection coating includes using a focused ion beam (FIB) etching process.

3. The method of claim 1, wherein modifying the output end includes using a focused ion beam (FIB) etching process to remove a section of the output end to form the angled facet.

4. The method of claim 1, wherein the ECDL includes a rotatable grating, and the method for producing the ECDL includes positioning the rotatable grating to allow light that is output from the laser chip to be directed to the rotatable grating at an inclined angle.

5. The method of claim 4, further comprising operating the laser chip to produce an output light having a first wavelength, and tuning the ECDL by rotating the rotatable grating to produce an output light having a second wavelength different than the first wavelength.

6. The method of claim 1, wherein the ECDL further includes a rotatable mirror positioned to receive at least a portion of light that is diffracted by a diffraction grating and to reflect the received portion back to the grating, and the method further comprises rotating the rotatable mirror to produce the output light having a first wavelength.

7. The method of claim 6, further comprising rotating the rotatable mirror to produce the output light having a second wavelength different than the first wavelength.

8. The method of claim 1, wherein the gain medium includes gallium nitride (GaN) or indium gallium nitride (InGaN), and the method further comprises tuning an output light of the ECDL to any wavelength in the range 400 to 470 nm.

9. The method of claim 1, wherein the gain medium includes aluminum indium gallium phosphide (AlInGaP) and the method further comprises tuning an output light of the ECDL to any wavelength in the range 630 to 690 nm.

10. The method of claim 1, wherein the angled facet forms a second surface of the gain medium and wherein the gain medium includes a first reflective surface opposite to the second surface, and wherein the Brewster's angle is computed to produce substantially no reflection, from the second surface, for light that travels from the first reflective surface to the second surface and to allow substantially all of the light that travels from the first reflective surface to the second surface to transmit through the second surface.

11. The method of claim 1, further comprising placing a grating in the EDCL, wherein the grating is positioned to receive light that is output from the angled facet.

* * * * *